United States Patent
Mathai et al.

(10) Patent No.: US 10,868,407 B2
(45) Date of Patent: Dec. 15, 2020

(54) MONOLITHIC WDM VCSELS WITH SPATIALLY VARYING GAIN PEAK AND FABRY PEROT WAVELENGTH

(71) Applicant: HEWLETT PACKARD ENTERPRISE DEVELOPMENT LP, Houston, TX (US)

(72) Inventors: Sagi Mathai, Palo Alto, CA (US); Michael Renne Ty Tan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 88 days.

(21) Appl. No.: 15/572,478

(22) PCT Filed: Jun. 4, 2015

(86) PCT No.: PCT/US2015/034272
§ 371 (c)(1),
(2) Date: Nov. 7, 2017

(87) PCT Pub. No.: WO2016/195695
PCT Pub. Date: Dec. 8, 2016

(65) Prior Publication Data
US 2018/0175587 A1   Jun. 21, 2018

(51) Int. Cl.
*H01S 5/40* (2006.01)
*H01S 5/183* (2006.01)
(Continued)

(52) U.S. Cl.
CPC .......... *H01S 5/4087* (2013.01); *H01L 27/156* (2013.01); *H01S 5/18305* (2013.01);
(Continued)

(58) Field of Classification Search
CPC ...... H01S 5/3414; H01S 5/3413; H01S 5/423; H01S 5/42; H01S 5/426; H01S 5/4087; H01S 5/4093
See application file for complete search history.

(56) References Cited

U.S. PATENT DOCUMENTS 5,583,351 A * 12/1996 Brown ............... B82Y 20/00
                                                    257/184
5,699,375 A * 12/1997 Paoli ................. B82Y 20/00
                                                    372/23
(Continued)

FOREIGN PATENT DOCUMENTS

EP    0865123 A2   9/1998
EP    0949728 A1   10/1999
(Continued)

OTHER PUBLICATIONS

Cole, G.D, et al., "Tunable Vertical-Cavity SOAs: A Unique Combination of Tunable Filtering and Optical Gain," (Research Paper), Jul. 25, 2005, 15 pages, http://www.engineering.ucsb.edu/~memsucsb/Research/publications/Cole_SPIE_05.pdf.
(Continued)

*Primary Examiner* — Joshua King
(74) *Attorney, Agent, or Firm* — Sheppard Mullin Richter & Hampton LLP (57) ABSTRACT

An array of monolithic wavelength division multiplexing (WDM) vertical cavity surface emitting lasers (VCSELs) with spatially varying gain peak and Fabry Perot wavelength is provided. Each VCSEL includes a lower distributed Bragg reflector (DBR), a Fabry Perot tuning/current spreading layer, and a structure comprising a multiple quantum well (MQW) layer sandwiched between a lower separate confinement heterostructure (SCH) layer and an upper SCH layer. The structure is sandwiched between the DBR and the Fabry Perot tuning/current spreading layer. Each MQW
(Continued)

experiences a different amount of quantum well intermixing and concomitantly a different wavelength shift. Each VCSEL further includes a top mirror on the Fabry Perot tuning/current spreading layer. A method is also provided for manufacturing the array.

19 Claims, 6 Drawing Sheets

(51) Int. Cl.
    *H01S 5/34*         (2006.01)
    *H01L 27/15*       (2006.01)
    *H01S 5/42*         (2006.01)
    *H01L 33/00*       (2010.01)
    *H01L 33/10*        (2010.01)
    *H01S 5/343*       (2006.01)

(52) U.S. Cl.
    CPC ...... *H01S 5/18311* (2013.01); *H01S 5/18358* (2013.01); *H01S 5/3414* (2013.01); *H01S 5/423* (2013.01); *H01L 33/0045* (2013.01); *H01L 33/105* (2013.01); *H01S 5/3432* (2013.01)

(56) References Cited

U.S. PATENT DOCUMENTS

| | | | |
|---|---|---|---|
| 5,708,674 A * | 1/1998 | Beernink | B82Y 20/00 257/E21.086 |
| 5,712,865 A | 1/1998 | Chow et al. | |
| 5,963,568 A * | 10/1999 | Paoli | H01S 5/423 372/23 |
| 6,117,699 A * | 9/2000 | Lemoff | H01S 5/423 438/35 |
| 6,258,615 B1 * | 7/2001 | Hou | H01S 5/0201 257/E21.131 |
| 6,259,121 B1 | 7/2001 | Lemoff et al. | |
| 6,341,137 B1 * | 1/2002 | Jayaraman | H01S 5/423 372/23 |
| 6,603,781 B1 | 8/2003 | Stinson et al. | |
| 6,611,546 B1 | 8/2003 | Garnache et al. | |
| 6,782,021 B2 | 8/2004 | Huang et al. | |
| 6,936,839 B2 | 8/2005 | Taylor | |
| 6,937,633 B2 | 8/2005 | Chua et al. | |
| 7,190,861 B2 | 3/2007 | Knopp et al. | |
| 7,381,581 B2 * | 6/2008 | Suzuki | H01S 5/423 257/E33.069 |
| 7,412,170 B1 * | 8/2008 | Louderback | H01S 5/423 398/158 |
| 8,687,665 B1 | 4/2014 | Tauke-Pedretti et al. | |
| 10,050,414 B2 * | 8/2018 | Mathai | H01S 5/18358 |
| 2002/0021733 A1 * | 2/2002 | Lee | H01S 5/423 372/96 |
| 2002/0097771 A1 * | 7/2002 | Hwang | H01S 5/18391 372/96 |
| 2002/0101904 A1 * | 8/2002 | Baillargeon | H01S 5/18358 372/98 |
| 2002/0105991 A1 | 8/2002 | Coldren et al. | |
| 2002/0106823 A1 * | 8/2002 | Hwang | H01S 5/18358 438/22 |
| 2002/0131668 A1 | 9/2002 | Marsh et al. | |
| 2003/0085409 A1 | 5/2003 | Shen et al. | |
| 2003/0123507 A1 * | 7/2003 | Wang | H01S 5/423 372/50.121 |
| 2003/0141511 A1 | 7/2003 | Marsh et al. | |
| 2004/0161005 A1 * | 8/2004 | Bour | B82Y 20/00 372/45.01 |
| 2004/0161006 A1 | 8/2004 | Chang et al. | |
| 2005/0063044 A1 | 3/2005 | Michie et al. | |
| 2005/0153473 A1 * | 7/2005 | Teng | H01L 33/0095 438/47 |
| 2007/0041416 A1 * | 2/2007 | Koelle | B82Y 20/00 372/50.124 |
| 2008/0310470 A1 * | 12/2008 | Ooi | B82Y 20/00 372/44.01 |
| 2009/0086784 A1 * | 4/2009 | Li | B82Y 20/00 372/50.11 |
| 2011/0150016 A1 * | 6/2011 | Park | H01S 5/4087 372/20 |
| 2012/0093189 A1 * | 4/2012 | Fattal | B82Y 20/00 372/50.11 |
| 2013/0335155 A1 * | 12/2013 | Sato | B82Y 20/00 331/94.1 |
| 2014/0023104 A1 * | 1/2014 | Suzuki | H01S 5/18341 372/50.124 |
| 2014/0133510 A1 * | 5/2014 | Sato | G04F 5/14 372/50.11 |
| 2014/0152393 A1 * | 6/2014 | Motomura | H01S 5/18377 331/94.1 |
| 2014/0354366 A1 * | 12/2014 | Suzuki | H01S 5/0421 331/94.1 |
| 2014/0354367 A1 * | 12/2014 | Suzuki | B82Y 20/00 331/94.1 |

FOREIGN PATENT DOCUMENTS

| | | |
|---|---|---|
| EP | 1364392 A2 | 11/2003 |
| WO | WO-9814807 A1 | 4/1998 |
| WO | WO-0069037 A2 | 11/2000 |
| WO | WO-200157565 A1 | 8/2001 |
| WO | WO-2004095662 A2 * | 11/2004 ............ B82Y 20/00 |

OTHER PUBLICATIONS

International Search Report & Written Opinion received in PCT Application No. PCT/US2015/034272, dated Mar. 4, 2016, 11 pages.
Yu, S.-F. et al., "Semiconductor Lasers Using Diffused Quantum-Well Structures," (Research Paper), 1998, pp. 723-735, http://hub.hku.hk/bitstream/10722/42795/1/44631.pdf?accept=1.
Herbert L., "Quantum Well Intermixing for Photonic IC Applications," (Research Paper), proceedings of SPIE 3491, Dec. 4, 1998, vol. 3491.
International Search Report & Written Opinion received in PCT Application No. PCT/US2015/012357, dated Oct. 19, 2015, 11 pages.
May-Arrioja, D. et al., "Intermixing of InP-based Multiple Quantum Wells for Integrated Optoelectronic Devices," (Research Paper), proceedings of ACM, Mar. 2009 vol. 40, No. 3 pp. 574-576.
Ryan L. et al., "Interdiffused Quantum Wells for Lateral Carrier Confinement in VCSELs," (Research Paper), proceedings of IEEE, Jul.-Aug. 1998, pp. 706-714.

* cited by examiner

MONOLITHIC WDM VCSELS WITH SPATIALLY VARYING GAIN PEAK AND FABRY PEROT WAVELENGTH

BACKGROUND

A datacenter is a facility used to house computer systems and associated components, such as telecommunications and storage systems. To handle increasing volumes of data, optical fiber is replacing copper wire. Due to the digital processing needed to make a copper solution work, a copper transceiver may consume up to 5-6 W of power. This is almost ten times as much as a fiber optic transceiver that consumes only 0.5 to 1 W.

VCSELs (Vertical Cavity Surface Emitting Lasers) are a type of semiconductor laser diode with laser beam emission perpendicular from the wafer surface, contrary to conventional edge-emitting semiconductor lasers (also in-plane lasers) which emit from surfaces formed by cleaving the individual chip out of a wafer. VCSELs may be used as a light source for optical fiber data transmission.

DETAILED DESCRIPTION

Once an optical fiber infrastructure is installed in datacenters, it is a daunting task to add more fibers to accommodate increasing bandwidth demands. Wavelength division multiplexing (WDM) is a means to increase the bandwidth density without increasing fiber count. Typical VCSEL-based WDM transmitters are composed of discrete VCSEL dies that emit light at unique wavelengths. This may translate to increased transmitter packaging complexity and cost.

In accordance with the teachings herein, monolithic WDM VCSEL arrays may use quantum well intermixing (QWI). Each VCSEL may include a bottom distributed Bragg reflector (DBR), a top mirror, and a laser cavity there-between. The laser cavity may include a multiple quantum well (MQW layer sandwiched between a lower separate confinement heterostructure (SCH) layer and an upper SCH layer. The multiple quantum well layer is made of alternating quantum well and barrier layers. Each VCSEL further includes a Fabry Perot tuning/current spreading layer as part of the laser cavity. In some cases, the Fabry Perot tuning/current spreading layer may have a length that varies from one VCSEL to another. In other cases, the Fabry Perot tuning/current spreading layer may be the same length for all VCSELS, but the top mirror may have different structures from one VCSEL to the next. Each VCSEL is formed with a different amount of quantum well intermixing and consequently experiences a different lasing wavelength shift.

By "quantum well intermixing" is meant a modification of the band gaps of the gain medium in the laser structure. The QWI allows a shift in the wavelength at which the gain is maximum. The Fabry Perot tuning/current spreading layer controls the resonant wavelength of the laser cavity.

While the QWI may not need to be impurity-free, the presence of impurities may lead to reliability issues, increased optical loss, and compromise VCSEL performance. QWI enables spatially tuning of the gain peak across the VCSEL array, so that each VCSEL or sets of VCSELs emit light at discrete wavelengths.

The teachings herein have the potential to more efficiently utilize datacenter optical fiber infrastructure, increase the bandwidth density of bundled optical connections, and reduce the packaging cost and complexity of VCSEL based WDM transmitters.

Impurity-free quantum well intermixing allows blue-shifting the emission wavelength of quantum well gain media in VCSELs without creating unwanted defects that can lead to high optical loss, performance, and reliability concerns.

A linear array of VCSELs may be fabricated, each VCSEL in the array emitting a different wavelength. Alternatively, the VCSELs may be arranged in two-dimensional arrays where each row emits a specific wavelength.

The VCSELs may be fabricated as top emitters or substrate side emitters and patterned with under bump metals and/or solder bumps for direct solder attachment to interposers, organic substrates, or PCBs. The VCSELS may alternatively be fabricated as bottom emitters, through the substrate.

Figure 1A:
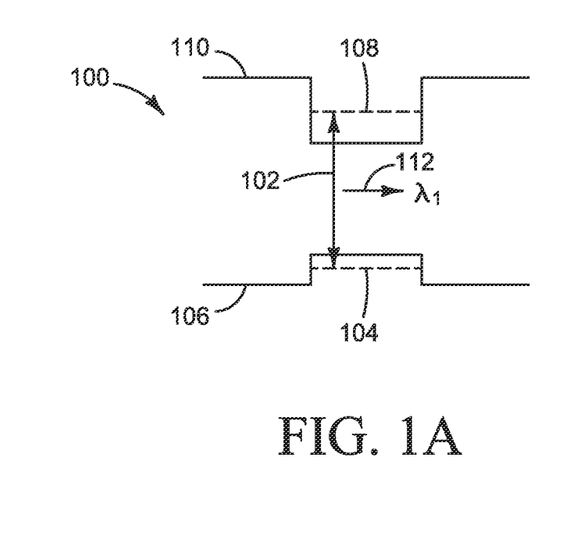
FIGS. 1A-1B depict a schematic view of quantum well intermixing (QWI) band diagrams for both an as-grown VCSEL band (FIG. 1A) and a post-QWI VCSEL band (FIG. 1B), according to an example.
Figure 1B:
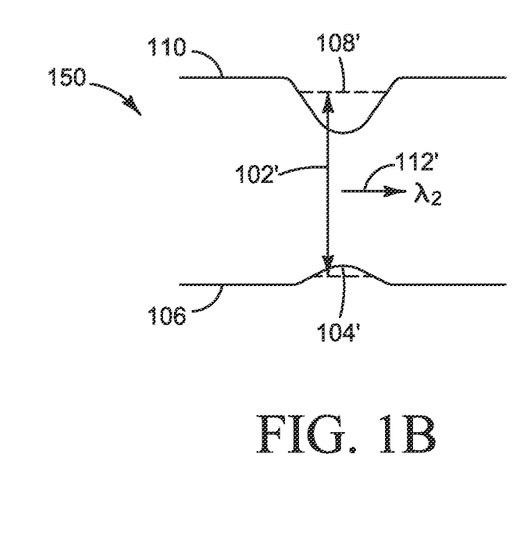

FIGS. 1A-1B are each a schematic view of the energy band diagrams 100, 150 of a quantum well gain medium, in an as-grown state (FIG. 1A) and after quantum well intermixing (FIG. 1B). In FIG. 1A, there is a distance, denoted by arrow 102, separating a hole energy level 104 in valence band 106 from an electron energy level 108 in conduction band 110. Light $\lambda_1$, denoted by arrow 112, is at a longer wavelength and is termed "red".

In FIG. 1B, after quantum well intermixing, the distance 102' between the hole energy level 104' and the electron energy level 108' may be increased by quantum well intermixing, as described in greater detail below. Light $\lambda_2$, denoted by arrow 112', is at a shorter wavelength and is termed "blue" or "blue-shifted".

FIGS. 1A-1B may be viewed as showing the energy band diagrams of two VCSELs gain media side by side, one in which no QWI has taken place and one in which QWI has taken place. By controlling the extent of QWI, more VCSELs may be placed side by side, each VCSEL emitting a different wavelength of light. The VCSEL gain media may incorporate multiple quantum wells. In this case, QWI will shift the gain peak of each quantum well in the gain media.

Figure 2:
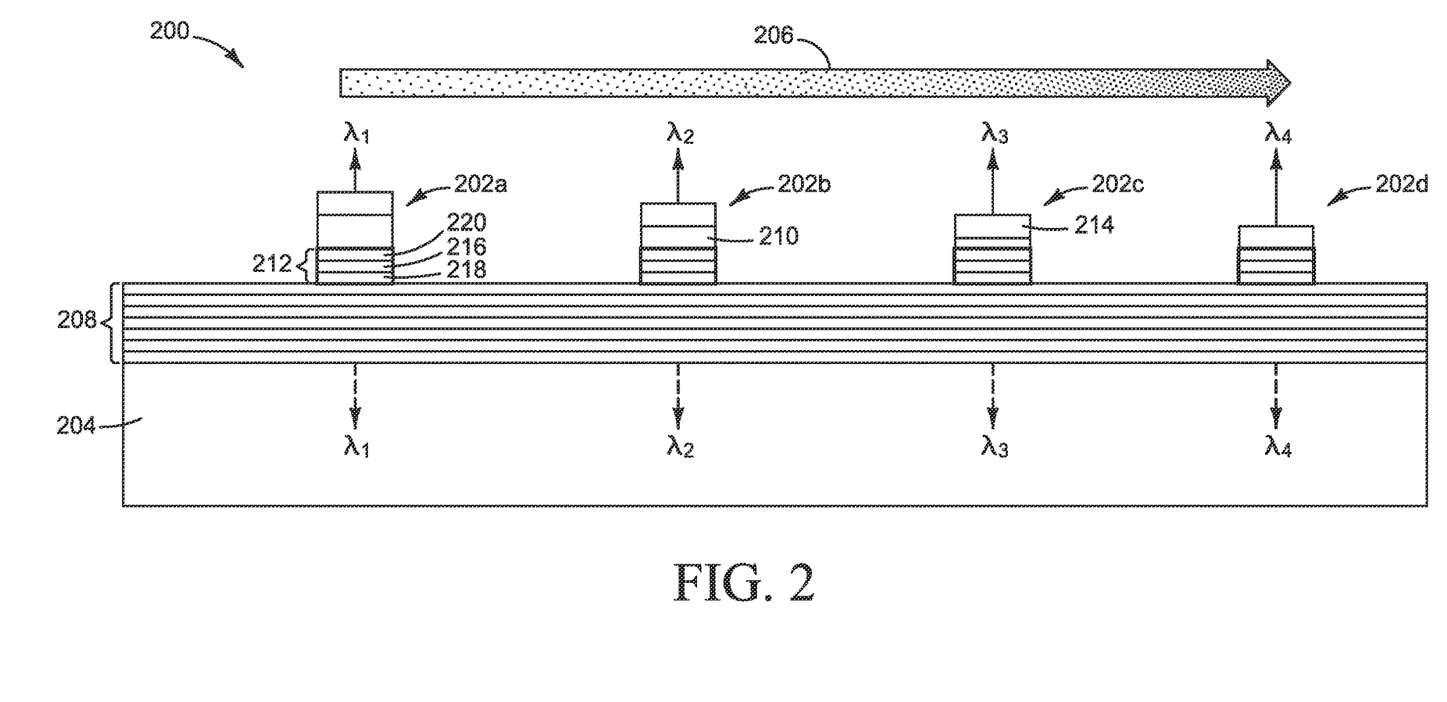
FIG. 2 is a side elevation view, depicting monolithic WDM (Wavelength Division Multiplexing) VCSELs with a spatially varying gain peak, according to an example.

FIG. 2 illustrates an example of a top emitting (or bottom emitting) WDM VCSEL array with spatially varying gain and Fabry Perot peak wavelength. FIG. 2 is a side elevational view of a configuration, or array, 200 of four VCSELs 202a, 202b, 202c, 202d, having been processed so that there is an increasing blue shift going from left to right of the Figure. Each VCSEL 202a, 202b, 202c, 202d is supported on a common substrate 204 and emits a different wavelength of light $\lambda_1$, $\lambda_2$, $\lambda_3$, $\lambda_4$, respectively. As shown by arrow 206, the array 200 has a spatially increasing blue shift. Specifically, the array 200 has spatially increasing blue-shifted gain media and decreasing effective laser cavity length.

As pictured, the array 200 may be a one-dimensional array of four VCSELs. Alternatively, the array 200 may be a row of four VCSELs in a two-dimensional array of VCSELs. While FIG. 2 depicts an array of four VCSELs, there may be fewer or more VCSELs in the array 200.

Each VCSEL 202a-202d may include a broadband lower distributed Bragg reflector 208 (common to all VCSELs 202a-202d), Fabry Perot tuning/current spreading layer 210, and a cavity and gain media 212 between the DBR 208 and the Fabry Perot tuning/current spreading layer 210, sometimes referred to herein as the Fabry Perot layer 210. A top mirror 214 may be formed on top of the Fabry Perot layer 210.

The Fabry Perot layer 210 serves as a wavelength filter, only allowing one particular wavelength to resonate inside the cavity. The Fabry Perot layer may be longest at the first VCSEL, since the cavity may be increasingly shorter for subsequent VCSELs. Spatial adjustment of the Fabry Perot layer ensures optimum offset between the cold cavity resonant wavelength and the intermixed MQW gain peak for optimum over-temperature performance. The cavity and gain media 212 in each case may include a multiple quantum well (MQW) layer 216 sandwiched between a lower separate confinement heterostructure (SCH) layer 218 and an upper SCH layer 220. The top mirror 214 serves as an upper mirror in the cavity, which includes the gain medium (the multiple quantum wells) 216, the SCH layers 218, 220, and the Fabry Perot layer 210.

The substrate 204 may be a III-V material, such as gallium arsenide (GaAs). The lower DBR 208 may be formed of alternating layers of, but not limited to, GaAs and aluminum gallium arsenide (AlGaAs). The lower and upper SCH layers 218, 220 may be AlGaAs. The MQW 216 may be alternating layers (not shown) of, but not limited to, GaAs and AlGaAs. It will be appreciated that various compositions of $Al_xGa_{1-x}As$, where x=0 to 1, may be employed, since all such compositions are lattice-matched to GaAs. Alternative materials may be employed in the MQW such as indium gallium arsenide (InGaAs) and indium gallium phosphide (InGaP) and gallium arsenide phosphide (GaAsP). The Fabry Perot tuning/current spreading layer 210 may be AlGaAs, GaAs, or alternating layers thereof.

Examples of structures that may be used as top mirror 214 include, but are not limited to, semiconductor Bragg reflectors, dielectric Bragg reflectors, dielectric (such as $SiO_2$) enhanced metal hybrid mirrors, transparent conductive oxide or nitride enhanced metal hybrid mirrors, high contrast gratings, suspended reflectors, and combinations thereof.

Since the variation in wavelength progresses in an orderly fashion from the spaced-apart VCSELs, this configuration 200 is called "monolithic WDM VCSELs with spatially varying gain peak". The configuration 200 is considered to be monolithic, since all VCSELs are fabricated on the same substrate, but for the amount of intermixing in the MQW and, potentially, the design of the top mirror. The point defects to induce intermixing may be introduced by creating a stress mismatch on a surface of the cap layers and propagating the point defects toward the MQW.

The array 200 is considered to be wavelength division multiplexing because of the different wavelengths emitted by the array of VCSELs.

A method of manufacturing an array of monolithic WDM VCSELs with QWI is provided. Each VCSEL may include a multiple quantum well and emitting light at a different wavelength from the others. The method may include creating point defects, such as vacancies, above the multiple quantum well layer, wherein different concentrations of point defects induce different amounts of intermixing between the quantum well and barrier materials and different wavelengths of light.

Figure 3:
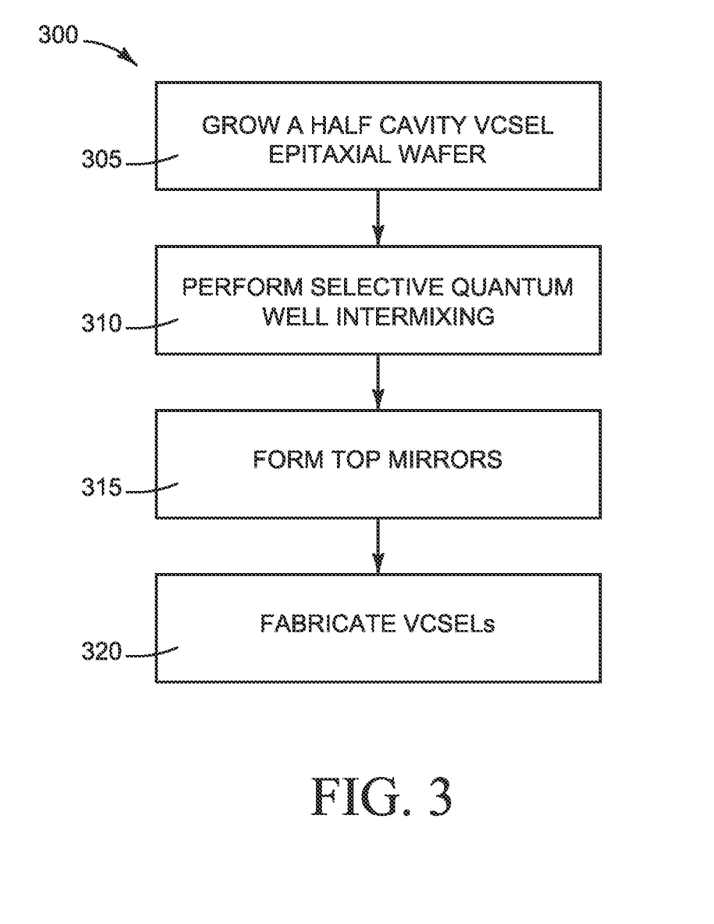
FIG. 3 is a flow chart, depicting a method of manufacturing an array of monolithic WDM VCSELs with QWI, according to an example.

The method 300 of manufacturing the array of VCSELs is illustrated in FIG. 3 and is as follows:
grow 305 a half cavity VCSEL epitaxial wafer;
perform 310 selective quantum well intermixing;
form 315 top mirrors;
fabricate 320 VCSELs.

By "grow a half cavity VCSEL epitaxial wafer" is meant forming the lower DBR layers 208 on the substrate 204, followed by forming the cavity and gain media 212, and the Fabry Perot tuning/current spreading layer 210, and then a sacrificial layer.

By "perform selective quantum well intermixing" is meant forming a patternable layer (such as $SrF_2$) on the sacrificial layer, patterning the patternable layer (by wet or dry etching, for example), blanket coating the patterned layer with a stress-inducing layer (such as $SiO_2$), and performing rapid thermal annealing to induce quantum well mixing in the MQW layer 216. The pattern selected may be such that the more area covered by the patterned layer, the less stress that can be induced in the MQW layer 216. That is, there may be less quantum well intermixing on the left side of the device in FIG. 2, and progressively more QWI proceeding across to the right side.

Due to the mismatch in crystal structure or coefficient of thermal expansion (CTE) between the stress-inducing layer and the sacrificial layer, point defects (not shown) may be generated in the sacrificial layer. In an example, the sacrificial layer may be GaAs. Heating, such as by rapid thermal annealing (RTA), may cause Ga to diffuse from the GaAs sacrificial layer into the stress-inducing layer, leaving behind point defects such as vacancies. Heating may drive the vacancies through the Fabry Perot layer 210 and upper SCH layer 220 toward the MQW 216 and induce intermixing between the quantum well and barrier layer materials. The RTA may be performed at a temperature within a range of about 600° to 1000° C. for a time within a range of about 10 sec to several minutes.

By "form top mirrors" is meant stripping off the blanket coat, the patterned layer, and the sacrificial layer, progressively thinning the Fabry Perot layer 210 across the surface from left to right (or progressively thickening the Fabry Perot layer 210 from right to left), with thicker portions aligned with less intermixing in the MQW 216, and forming the top mirror 214 onto the Fabry Perot layer 210. The top mirror conforms to the progressively thinned Fabry Perot layer 210. Alternatively, by "form top mirrors" is meant providing different structures for each top mirror 214.

By "fabricate VCSELs" is meant forming the array 200 of VCSELs, in which individual VCSELs 202a-2-2d may be formed by etching and wet oxidation. A lower contact (not shown) may be formed on the lower DBR 208 surface or substrate 204. A top contact (not shown) may be formed on the top mirror or Fabry Perot layer 210.

FIGS. 4A-4F and FIGS. 5A-5F each illustrate an example method for manufacturing an array of VCSELs. In both examples, an array 200 of four VCSELs 202a-202d (FIG. 4F) or an array 200' of four VCSELs 202a'-202d', with reference to FIG. 2, may be fabricated. It may be appreciated that more, or less, than four VCSELs may be made by these methods.

These example methods are provided for teaching one skilled in the art for manufacturing an array of VCSELs. However, examples of other methods may also be devised; such methods are considered to fall within the scope of the appended claims.

Figure 4A:
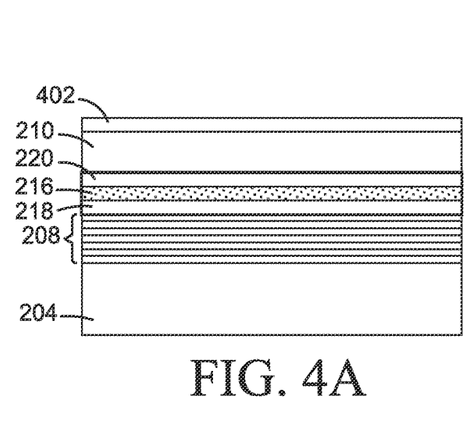
FIGS. 4A-4F are each a side-elevational view, illustrating a method for manufacturing an array of monolithic WDM VCSELs with QWI, according to an example.

Turning now to FIGS. 4A-4F, a first example method starts in FIG. 4A with providing a substrate 204, with reference to FIG. 2. The lower DBR 208 may be formed on the top of the substrate 204. The lower SCH layer 218, the quantum wells and barriers for the MQW 216, and the upper confinement layer 220 may each be formed in turn over the lower DBR 208. The Fabry Perot layer 210 may be formed on top of the upper confinement layer 220. A sacrificial cap layer 402 may be formed on the top of the Fabry Perot layer 210. The sacrificial cap layer 402 may be of GaAs or AlGaAs, and may be removed in a later stage of the method. The thickness of the sacrificial cap layer 402 may be in the range of about 10 to 200 nm. In other approaches, the upper SCH layer 220 may be replaced with or include a thin etch stop layer, such as, but not limited to, AlAs, AlGaAs, InGaP, and capped with the GaAs sacrificial cap layer 402.

Figure 4B:
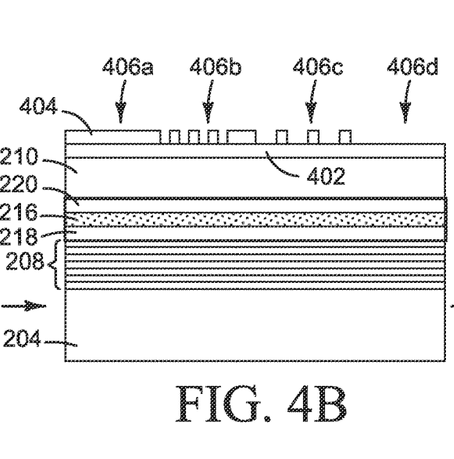

In FIG. 4B, selectively intermixing the quantum wells may be achieved by covering the top surface of the sacrificial cap layer 402 with a patternable layer 404 and patterning this layer to form areas 406a, 406b, 406c, 406d where a blue shift is desired. The thickness of the patternable layer 404 may be in the range of about 50 to 200 nm. An example of the patternable layer 404 is $SrF_2$, which can be patterned to expose the different areas 406a-406d. In patterning, a higher percent of $SrF_2$ is left in places where less blue shift is desired. For example, the four areas may be covered as follows to provide a blue shift across the surface: 100% (406a), 75% (406b), 50% (406c), and 0% (406d), where 100% coverage leads to lower blue shift and 0% coverage leads to greater blue shift. The patterning may be performed using a linewidth pattern in which the linewidths may be in the range 1 to 200 µm.

Figure 4C:
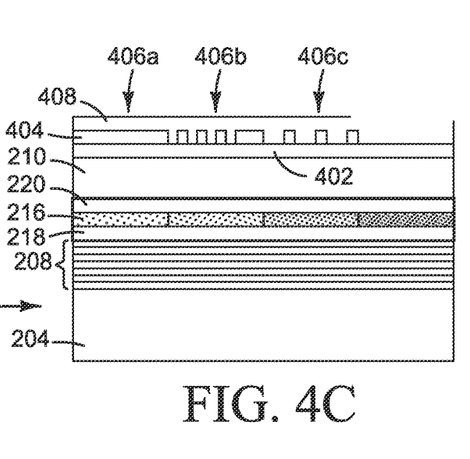

In FIG. 4C, the entire structure may be blanket-coated with a stress-inducing layer 408 such as of $SiO_2$, followed by heating to perform the quantum well intermixing. The heating may be performed by rapid thermal annealing (RTA).

Due to the mismatch in crystal structure or coefficient of thermal expansion (CTE) between the stress-inducing layer 408 and the sacrificial layer 402, point defects (not shown) may be generated in the sacrificial layer. Heating, such as by rapid thermal annealing (RTA), may cause Ga to diffuse from the Ga-containing sacrificial layer 402 into the stress-inducing layer 408, leaving behind point defects such as vacancies. Heating may then drive the vacancies through the upper SCH layer 220 toward the MQW 216 and induce intermixing between the quantum well and barrier layer materials. The RTA may be performed at a temperature within a range of about 600° to 1000° C. for a time within a range of about 10 sec to several minutes.

The presence of the point defects may induce intermixing in the MQW 216 and may cause a change in the energy hole level 104 and the electron energy level 108, resulting in an increase in the distance 102' between the hole energy level 104' and the electron energy level 108' (see FIG. 1), thereby blue-shifting the gain peak, and therefore the light emitted from a VCSEL formed locally from those areas covered by the stress-inducing layer. In general, the more point defects, the greater the blue shift. The number of point defects or the extent of quantum well intermixing to provide a specific wavelength shift may be established empirically, and may depend on the design of the epitaxial layers and the properties of the sacrificial cap layer 402, the patternable layer 404, and the stress-inducing layer 408.

There are a number of different ways to control the concentration of point defects. For example, stress mismatch between the stress-inducing layer 408 and the sacrificial GaAs cap layer 402 may be altered in progressing across the substrate from the original, unstressed MQW region (from left to right in FIG. 4O). Increasing the stress increases the point defect concentration, which in turn causes a greater blue-shifting of the emitted light.

Alternatively, and as shown in FIGS. 4B-4C, a material with a lower Ga diffusion coefficient, such as $SrF_2$ 404, can be patterned below the $SiO_2$ layer 408 to spatially control the concentration of point defects, and therefore, the blue shift. In this case, only a single RTA heating step is required. Another method is to pattern or modify the thickness of the $SiO_2$ layer 408 to control the concentration of vacancies formed in the Ga-containing layer 402.

The stress-inducing layer 408 may be a material that is lattice-mismatched or CTE (coefficient of thermal expansion)-mismatched with the sacrificial layer 402, here, GaAs or AlGaAs. Further, Ga is to be able to diffuse through the material. Examples of such materials include, but are not limited to, $SiO_2$, $SiO_x$, silicon oxynitride, and $Si_xN_y$. The diffusion of Ga into $SrF_2$ is less than into $SiO_2$.

The shading of MQW layer 216 has been altered from its original shading, shown in FIGS. 4A-4B, to reflect the fact that each section of the MQW layer 216, corresponding to the patterned stress-inducing regions 406a-406d, has been successively blue-shifted, due to the quantum well intermixing.

Figure 4D:
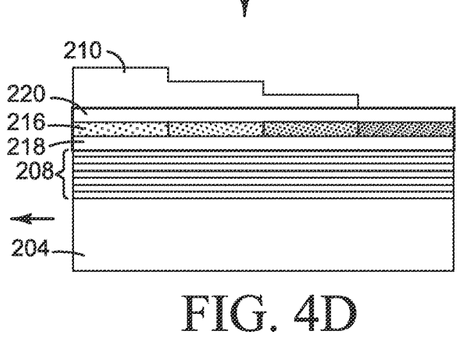

Next, as shown in FIG. 4D, the stress-inducing layer 408, the patternable layer 404 and the sacrificial Ga-containing cap layer 402 may be removed. Removal of the sacrificial cap layer 402 may be desired, since the cap layer may have excess defects that contribute to optical loss, poor laser performance, and poor growth surface on which to form the top mirror 214. The Fabry Perot layer 210 may be successively thinned in going from left to right, so that the Fabry Perot layer 210 is thickest in the 406a region and thinnest in the 406d region. The Fabry Perot layer may be provisioned with etch stop layers (not shown). Etch stop layers in combination with selective etching techniques can be used for precise laser cavity thickness control. Alternatively, the Fabry Perot layer 210 can be increased from right to left by adding material.

Figure 4E:
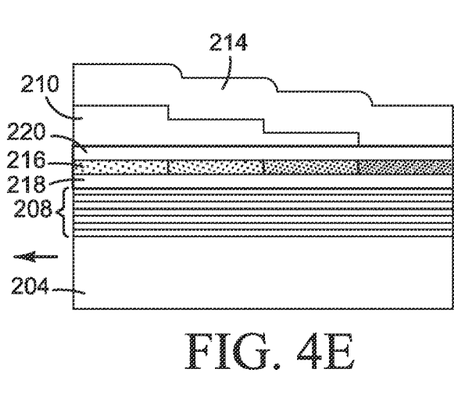

Next, as shown in FIG. 4E, the top mirror 214 may be deposited on the Fabry Perot layer 210. The deposition may be conformal, to follow the stepped contour of the Fabry Perot layer 210. The top mirror 214 may be deposited to a thickness within a range of 0.1 to 10 µm. Deposition of the top mirror 214 may be performed by, but not limited to, any of metal organic chemical vapor deposition (MOCVD), molecular beam epitaxy (MBE), atomic layer deposition (ALD), plasma-enhanced chemical vapor deposition (PECVD), sputtering, electron beam evaporation, thermal evaporation, or combinations thereof.

Figure 4F:
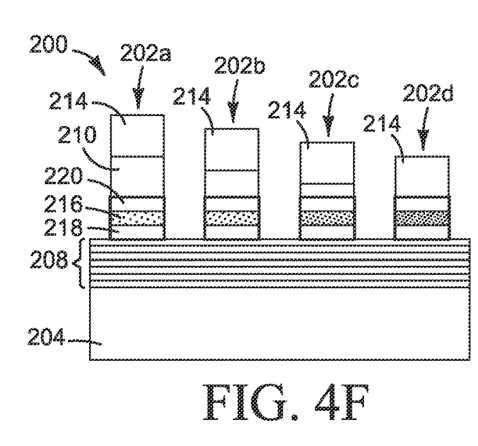

Finally, as shown in FIG. 4F, an array 200 of VCSELs 202a, 202b, 202c, 202d is formed. The individual VCSELs 202a-202d may be formed by etching and wet oxidation. An oxide aperture (not shown in FIG. 4F, but depicted in FIG. 6) may be added to each VCSEL 202a-202d. The arrangement of P-ohmic and N-ohmic contacts (not shown) may depend on the type of mirror 214 and the choice between top or bottom emission.

An example of a completed VCSEL 202a-202d may include the doped or semi-insulating GaAs substrate 204, on which is formed the lower Bragg reflector 208 of multiple periods of n-AlGaAs/AlAs/GaAs. On the lower Bragg reflector 208 may be formed the lower SCH layer 218 of AlGaAs. On the lower SCH layer 218 may be formed the multiple quantum well layer 216, formed of alternating layers of a quantum wells of InGaAs and barriers of AlGaAs. On the multiple quantum well layer 216 may be formed the upper confinement layer 220, formed of AlGaAs. On the upper confinement layer 220 may be formed the Fabry Perot layer 210, formed of AlGaAs, AlAs, GaAs, or alternating layers thereof. On the Fabry Perot layer 210 may be formed the top mirror 214. The materials/structures for the top mirror 214 are discussed above.

Figure 5A:
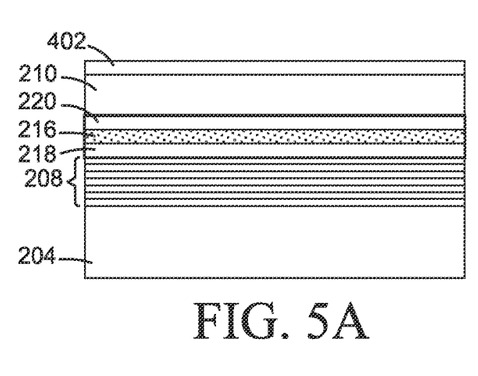
FIGS. 5A-5F are each a side-elevational view, illustrating another method for manufacturing an array of monolithic WDM VCSELs with QWI, according to an example.

Turning now to FIGS. 5A-5F, a second example method starts in FIG. 5A with providing a substrate 204, with reference to FIG. 2. FIG. 5A is essentially identical to FIG. 4A. As in FIG. 4A, the lower DBR 208 may be formed on the top of the substrate 204. The lower SCH layer 218, the quantum wells and barriers for the MQW 216, and the upper confinement layer 220 may each be formed in turn over the lower DBR 208. The Fabry Perot layer 210 may be formed on top of the upper confinement layer 220. A sacrificial cap layer 402 may be formed on the top of the Fabry Perot layer 210. The sacrificial cap layer 402 may be of GaAs or AlGaAs, and may be removed in a later stage of the method. The thickness of the sacrificial cap layer 402 may be in the range of about 10 to 200 nm. In other approaches, the upper SCH layer 220 may be replaced or include with a thin etch stop layer, such as, but not limited to, AlAs, AlGaAs, InGaP, and capped with the GaAs sacrificial cap layer 402.

Figure 5B:
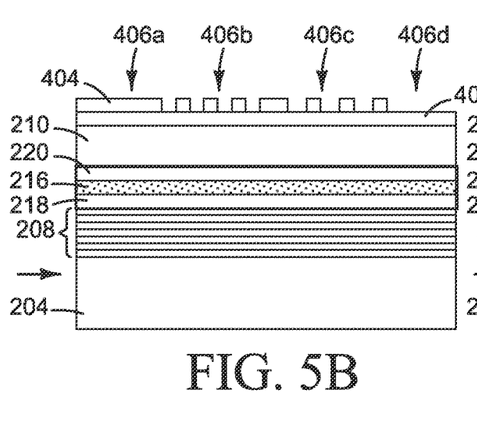

In FIG. 5B, which is essentially identical to FIG. 4B, selectively intermixing the quantum wells may be achieved by covering the top surface of the sacrificial cap layer 402 with a patternable layer 404 and patterning this layer to form areas 406a, 406a, 406c, 406d where a blue shift is desired. The thickness of the patternable layer 404 may be in the range of about 50 to 200 nm. An example of the patternable layer 404 is SrF$_2$, which can be patterned to expose the different areas 406a-406d. In patterning, a higher percent of SrF$_2$ is left in places where less blue shift is desired. For example, the four areas may be covered as follows to provide a blue shift across the surface: 100% (406a), 75% (406b), 50% (406c), and 0% (406d), where 100% coverage leads to lower blue shift and 0% coverage leads to greater blue shift. The patterning may be performed using a linewidth pattern in which the linewidths may in the range 1 to 200 μm.

Figure 5C:
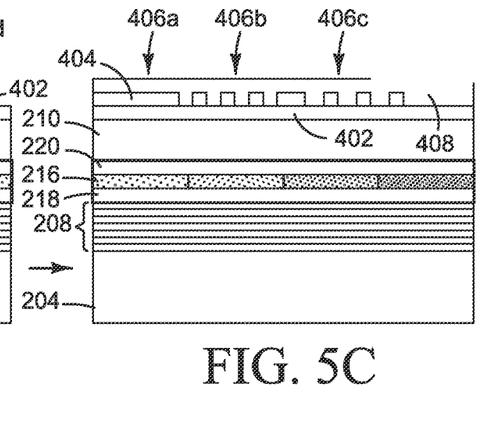

In FIG. 5C, which is essentially identical to FIG. 4C, the entire structure may be blanket-coated with a stress-inducing layer 408 such as of SiO$_2$, followed by heating to perform the quantum well intermixing. The heating may be performed by rapid thermal annealing (RTA).

Due to the mismatch in crystal structure or coefficient of thermal expansion (CTE) between the stress-inducing layer 408 and the sacrificial layer 402, point defects (not shown) may be generated in the sacrificial layer. Heating, such as by rapid thermal annealing (RTA), may cause Ga to diffuse from the Ga-containing sacrificial layer 402 into the stress-inducing layer 408, leaving behind point defects such as vacancies. Heating may then drive the vacancies through the upper SCH layer 220 toward the MQW 216 and induce intermixing between the quantum well and barrier layer materials. The RTA may be performed at a temperature within a range of about 600° to 1000° C. for a time within a range of about 10 sec to several minutes.

The presence of the point defects may induce intermixing in the MQW 216 and may cause a change in the energy hole level 104 and the electron energy level 108, resulting in an increase in the distance 102' between the hole energy level 104' and the electron energy level 108' (see FIG. 1), thereby blue-shifting the gain peak, and therefore the light emitted from a VCSEL formed locally from those areas covered by the stress-inducing layer. In general, the more point defects, the greater the blue shift. The number of point defects or the extent of quantum well intermixing to provide a specific wavelength shift may be established empirically, and may depend on the design of the epitaxial layers and the properties of the sacrificial cap layer 402, the patternable layer 404 and the stress-inducing layer 408.

There are a number of different ways to control the concentration of point defects. For example, stress mismatch between the stress-inducing layer 408 and the sacrificial GaAs cap layer 402 may be altered in progressing across the substrate from the original, unstressed MQW region (from left to right in FIG. 5C). Increasing the stress increases the point defect concentration, which in turn causes a greater blue-shifting of the emitted light.

Alternatively, and as shown in FIGS. 5B-5C, a material with a lower Ga diffusion coefficient, such as SrF$_2$ 404, can be patterned below the SiO$_2$ layer 408 to spatially control the concentration of point defects, and therefore, the blue shift. In this case, only a single RTA heating step is required. Another method is to pattern or modify the thickness of the SiO$_2$ layer 408 to control the concentration of vacancies formed in the Ga-containing layer 402.

The stress-inducing layer 408 may be a material that is lattice-mismatched or CTE (coefficient of thermal expansion)-mismatched with the sacrificial layer 402, here, GaAs or AlGaAs. Further, Ga is to be able to diffuse through the material. Examples of such materials include, but are not limited to, SiO$_2$, SiO$_x$, silicon oxynitride, and Si$_x$N$_y$. The diffusion of Ga into SrF$_2$ is less than into SiO$_2$.

The shading of MQW layer 216 has been altered from its original shading, shown in FIGS. 5A-5B, to reflect the fact that each section of the MQW layer 216, corresponding to the patterned stress-inducing regions 406a-406d, has been successively blue-shifted, due to the quantum well intermixing.

Figure 5D:
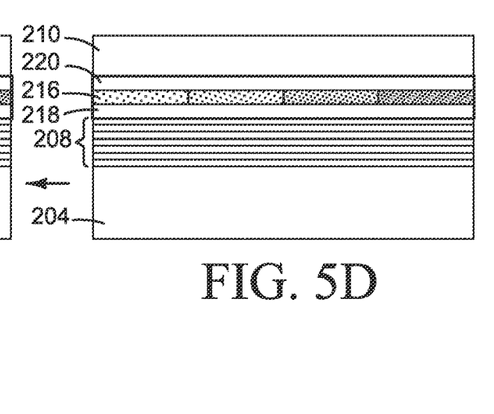

Next, as shown in FIG. 5D, the stress-inducing layer 408, the patternable layer 404, and the sacrificial Ga-containing cap layer 402 may be removed. Removal of the sacrificial cap layer 402 may be desired, since the cap layer may have excess defects that contribute to optical loss, poor laser performance, and poor growth surface on which to form the top mirror 214.

Figure 5E:
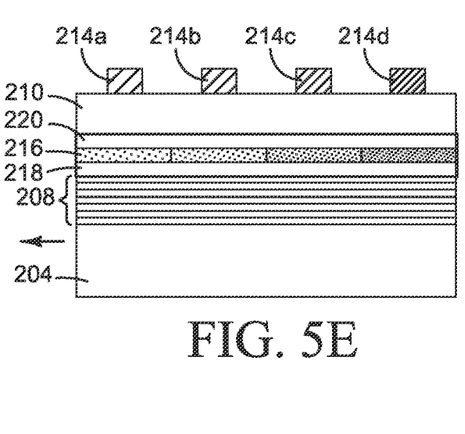

Next, as shown in FIG. 5E, a plurality of top mirrors 214a-214d may be deposited on the Fabry Perot layer 210. Each top mirror 214a-214d is aligned with the stress-inducing regions 406a-406d. The top mirrors 214a-214d may be deposited to a thickness within a range of 0.1 to 10 μm. Deposition of the top mirror 214a-214d may be performed by, but not limited to, any of metal organic chemical vapor deposition (MOCVD), molecular beam epitaxy (MBE), atomic layer deposition (ALD), plasma-enhanced chemical vapor deposition (PECVD), sputtering, electron beam evaporation, thermal evaporation, or combinations thereof. In this example method, different wavelengths may be achieved by employing different structures for the top mirrors 214a-214d. This may be accomplished by employing different reflectivities and different phase responses (phase resonance condition in the cavity) for each of the top mirror 214 structures, in an example, high contrast gratings may be employed, each with a different pattern. In an alternate example, dielectric DBR mirrors may be employed.

Figure 5F:
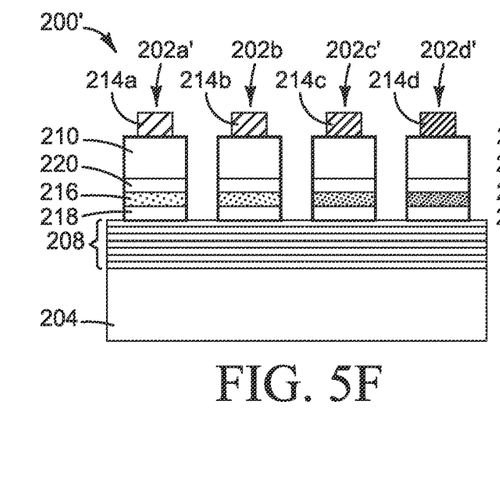

Finally, as shown in FIG. 5F, an array 200' of VCSELs 202a', 202b', 202c', 202d' is formed. The prime associated with each reference number is a recognition that the VCSEL structure is somewhat modified from FIG. 2. The individual VCSELs 202a'-202d' may be formed by etching and wet oxidation. An oxide aperture (not shown in FIG. 5F but depicted in FIG. 6) may be added to each VCSEL 202a-202d. The arrangement of P-ohmic and N-ohmic contacts (not shown) may depend on the type of mirror 214 and the choice between top or bottom emission.

An example of a completed VCSEL 202a'-202d' may be similar to that given above for VCSEL 202a-202d.

Shown above is an example in which the Fabry Perot tuning/current spreading layer 210 has a different thickness for each VCSEL in the array and in which the top mirror 214 has the same structure (FIGS. 4A-4F). Also shown above is an example in which the Fabry Perot tuning/current spreading layer 210 has the same thickness for each VCSEL in the array and in which the top mirror 214 has a different structure for each VCSEL in the array (FIGS. 5A-5F). It may be appreciated that in yet another example, the Fabry Perot tuning/current spreading layer 210 may have a different thickness for each VCSEL in the array and the top mirror 214 may have a different structure for each VCSEL in the array.

Figure 6:
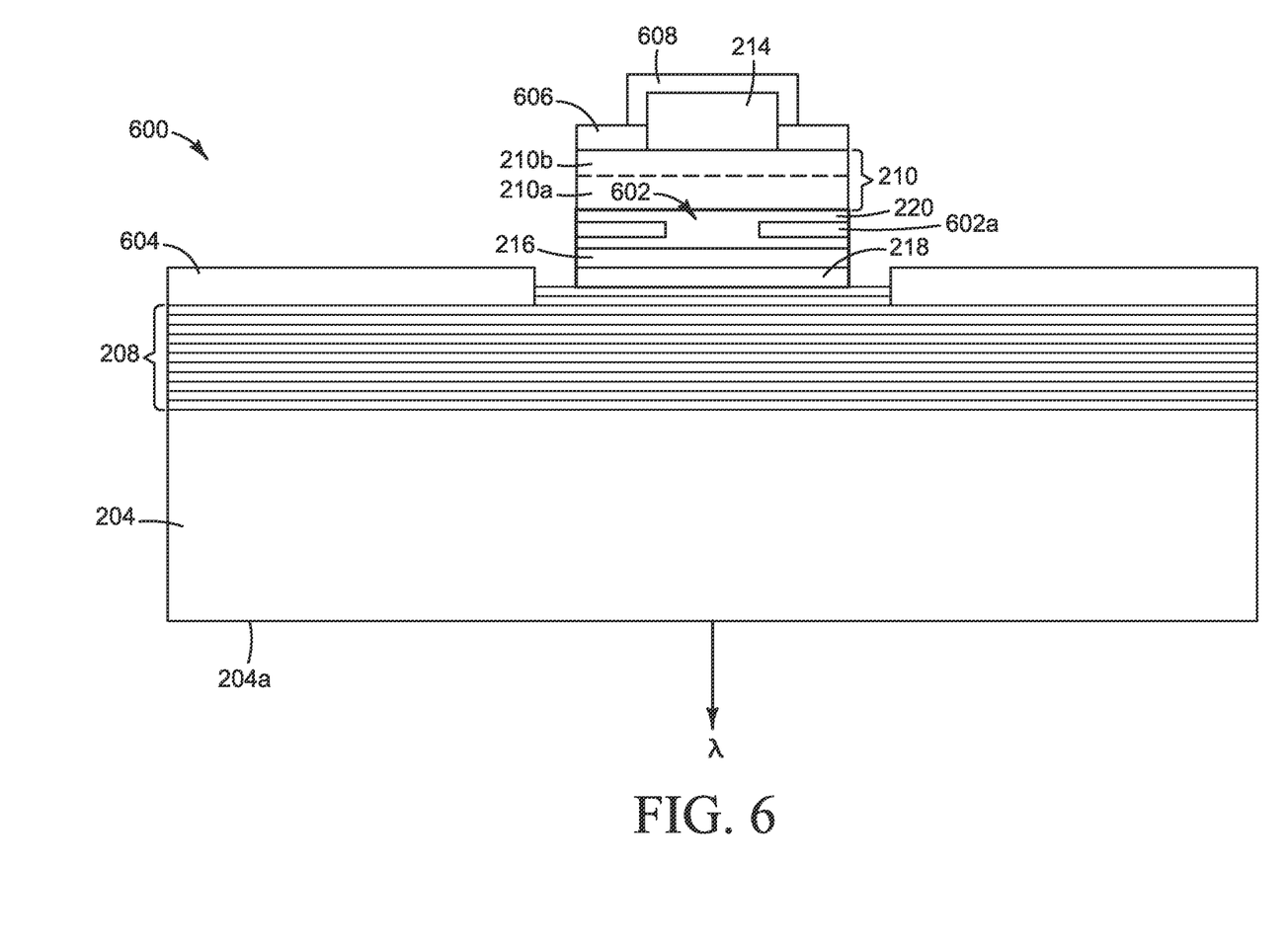
FIG. 6 is a side-elevational view, depicting a bottom emitting VCSEL structure, according to an example.

The foregoing description has been primarily directed to a top emitting VCSEL. FIG. 6 depicts an example of a completed bottom emitting VCSEL 600. The bottom emitting VCSEL 600 may include the substrate 204, on which may be disposed the semiconductor DBR 208. The substrate may be n-type or semi-insulating. In contact with the DBR 208 may be the lower SCH layer 218, on which may be disposed the multiple quantum well 216. An upper SCH layer 220, including an oxide aperture structure 602 may be disposed on or offset above and/or below from the multiple quantum well 216. The Fabry Perot layer 210 may be disposed over the oxide aperture structure 602. The mirror layer 214 may be disposed on the Fabry Perot layer 210. The oxide aperture may be incorporated into the lower DBR 208, Fabry Perot layer 210, or mirror layer 214. In some embodiments, the oxide aperture may be formed prior to formation of the top mirror layer 214.

The oxide aperture structure 602 may be made up of two portions, a layer of AlGaAs, serving as the upper SCH 220, in which is formed a dielectric aperture 602a. The AlGaAs of the upper SCH 220 may be a high Al-containing composition, such as 98% Al. By patterning a mesa and exposing the upper SCH 220 sidewalls to water vapor at an elevated temperature, such as 400° C., AlGaAs may be converted into an aluminum oxide. The time of exposure may control how far into the SCH 220 the aluminum oxide ring 602a extends. The aluminum oxide ring 602a serves as a current blocking layer and optical confinement layer (since it has a lower index of refraction compared to that of AlGaAs), and may act to confine light in the horizontal direction.

In previous discussions, the Fabry Perot layer 210 primarily served as a tuning layer. In this example, it may serve an additional function as a current spreading layer, in which it spreads the current in the horizontal direction and reduces the resistance for the current to try to flow more uniformly through the oxide aperture structure 602. The current spreading function may be aided by doping the Fabry Perot layer 210 more heavily than in other examples. Alternatively, two regions 210a, 210b may be provided, with one region 210a primarily directed to tuning and the other region 210b primarily directed to current spreading. The dashed line separated these two layers is to show this alternative configuration. Doping in either example may be P-type and achieved with carbon.

Contact to the VCSEL 600 may be provided by an N-ohmic contact 604 disposed on the lower DBR 208. A P-ohmic contact 606 may be disposed on the Fabry Perot layer 210. Lenses (not shown) may be integrated on the backside 204a of the VCSEL 600. Light h may be emitted from the bottom of the VCSEL 600.

The N-ohmic contact 604 may be provided using gold, germanium, and nickel. The P-ohmic contact 606 may be provided using titanium, platinum, and gold.

A cap layer 608 may be used to seal the mirror 214 and also provide additional reflectivity. The cap layer 608 may be, but not limited to, gold and the same material as the P-ohmic contact 606.

The preceding description has been presented to illustrate and describe examples of the principles described. This description is not intended to be exhaustive or to limit these principles to any precise form disclosed. Many modifications and variations are possible in light of the above teaching.

In the foregoing description, numerous details are set forth to provide an understanding of the examples disclosed herein. However, it will be understood that the examples may be practiced without these details. While a limited number of examples have been disclosed, it should be understood that there are numerous modifications and variations therefrom.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the foregoing detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc. Similar or equal elements in the Figures may be indicated using the same numeral.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims. While a limited number of examples have been disclosed, it should be understood that there are numerous modifications and variations therefrom.

What is claimed is:

1. An array of monolithic wavelength division multiplexing (WDM) vertical cavity surface emitting lasers (VCSELs) with spatially varying gain peak and Fabry Perot wavelength, including:
   a first VCSEL, wherein the first VCSEL comprises:
      a lower distributed Bragg reflector (DBR);
      a first Fabry Perot tuning/current spreading layer; and
      a first structure comprising a first multiple quantum well (MQW) layer sandwiched between a first lower separate confinement heterostructure (SCH) layer and a first upper SCH layer, the first structure sandwiched between the DBR and the first Fabry Perot tuning/current spreading layer, the first MQW layer experiencing a different first amount of quantum well intermixing that is induced by a correspondingly different first concentration of point defects selectively created using a first patternable layer that is patterned to cover a first area on a first sacrificial layer on the first Fabry Perot tuning/current spreading layer above the first MQW layer and concomitantly a different first wavelength shift;

and a first top mirror on the first Fabry Perot tuning/current spreading layer; and a second VCSEL, wherein the second VCSEL comprises:
the lower DBR reflector;
a second Fabry Perot tuning/current spreading layer;
a second structure comprising a second MQW layer sandwiched between a second lower SCH layer and a second upper SCH layer, the second structure sandwiched between the DBR and the second Fabry Perot tuning/current spreading layer, the second MQW layer experiencing a second amount of quantum well intermixing that is induced by a correspondingly second concentration of point defects selectively created using a second patternable layer that is patterned differently from the first patternable layer to cover a second area on a second sacrificial layer on the second Fabry Perot tuning/current spreading layer above the second MQW and concomitantly a second wavelength shift, wherein the first amount of quantum well intermixing is different than the second amount of quantum well intermixing; and a second top mirror in the second Fabry Perot tuning/current spreading layer.

2. The array of claim 1, in which the lower DBR comprises layers of GaAs and AlGaAs, the lower and upper SCH layers comprise GaAs and AlGaAs, and the MQW comprises layers of GaAs or InGaAs, and AlGaAs or InGaP or GaAsP.

3. The array of claim 1, in which the first and the second Fabry Perot tuning/current spreading layer comprises AlGaAs, GaAs, or alternating layers of AlGaAs and GaAs.

4. The array of claim 1, in which the first and the second top mirror comprises any of semiconductor Bragg reflectors, dielectric Bragg reflectors, dielectric enhanced metal hybrid mirrors, transparent conductive oxide or nitride enhanced metal hybrid mirrors, high contrast gratings, suspended reflectors, and combinations thereof.

5. The array of claim 1, in which the first and the second VCSELs are arranged in a linear fashion, the first and the second VCSELs having a larger quantum well intermixing in a particular direction, the first and the second VCSELs emitting light of a wavelength that is blue-shifted in the direction of larger quantum well intermixing.

6. The array of claim 5, in which the first concentration of point defects are created by a stress mismatch between a first stress-inducing layer and the first sacrificial layer, and the second concentration of point defects are created by a stress mismatch between a second stress-inducing layer and the second sacrificial layer, with a greater number of point defects resulting in a larger quantum well intermixing.

7. The array of claim 1, in which the first and second Fabry Perot tuning/current spreading layers have different thickness for the first and second VCSELs in the array and in which the first and the second top mirrors have the same structure or in which the first and the second Fabry Perot tuning/current spreading layers have the same thickness for the first and the second VCSELs in the array and in which the first and the second top mirrors have a different structure for the first and the second VCSELs in the array or in which the first and the second Fabry Perot tuning/current spreading layers have a different thickness for the first and the second VCSELs in the array and in which the first and the second top mirrors have a different structure for the first and the second VCSELs in the array.

8. The array of claim 1, further including appropriate ohmic contacts.

9. The array of claim 1, in which the first and the second VCSELs either emit light from the top side or from the bottom side.

10. The array of claim 1, wherein the first area covered by the first patternable layer induces a first amount of stress in the first MQW layer that further induces the first amount of quantum well intermixing experienced by the first MQW layer.

11. The array of claim 1, wherein the second area covered by the second patternable layer is larger than the first area covered by the first patternable area, and induces a second amount of stress in the second MQW layer that is less than the first amount of stress in the first MQW layer, and further wherein the second amount of stress further induces the second amount of quantum well intermixing experienced by the second MQW layer that is larger than the first amount of quantum well intermixing experienced by the first MQW layer.

12. The array of claim 11, where the first patternable layer spatially controls the first concentration of point defects and a blue shift of the first wavelength shift, and the second patternable layer spatially controls the second concentration of point defects and a blue shift of the second wavelength shift.

13. The array of claim 1, wherein the first patternable layer and the second patternable layer are patterned using a linewidth pattern, wherein linewidths within the linewidth pattern are in the range 1 µm to 200 µm.

14. A method of manufacturing an array of monolithic wavelength division multiplexed (WDM) vertical cavity surface emitting lasers (VCSELs) with spatially varying gain peak and Fabry Perot wavelength, the method including:

growing a half cavity VCSEL epitaxial wafer forming multiple layers comprising a multiple quantum well (MQW) layer;

performing selective quantum well intermixing, wherein performing selective quantum well intermixing comprises:

patterning a first patternable layer that is patterned to cover a first area on a sacrificial layer above the multiple MQW layer, and forming a first VCSEL of the array with a first amount of quantum well intermixing causing a first amount of lasing wavelength shift, patterning a second patternable layer that is patterned differently from the first patternable layer to cover a second area on the sacrificial layer above the multiple MQW layer, and forming and a second VCSEL of the array with a second amount of quantum well intermixing causing a second amount of lasing wavelength shift, wherein the selective quantum well intermixing causes a first MQW of the multiple MQW layer and second MQW of the multiple MQW layer to experience a different amount of quantum well intermixing induced by a correspondingly first concentration of point defects selectively created above the first MQW via the first patternable layer and a second concentration of point defects selectively created above the second MQW via the second patternable layer;

forming a first top mirror and a second top mirror; and fabricating a first VCSEL and a second VCSEL, wherein the first and the second VCSELs are fabricated to emit a different wavelength of light due to the selective quantum well intermixing.

15. The method of claim 14, in which growing a half cavity VCSEL epitaxial wafer forming multiple layers further comprises forming a lower DBR layer on a substrate, followed by the gain media sandwiched by a first SCH layer corresponding to the first VCSEL and a second SCH layer corresponding to the second VCSEL, a first Fabry Perot tuning/current spreading layer corresponding to the first VCSEL and a second Fabry Perot tuning/current spreading layer corresponding to the second VCSEL, and then the sacrificial layer.

16. The method of claim 15, in which performing selective quantum well intermixing further comprises:

for the first MQW corresponding to the first VCSEL:
blanket coating the first patterned layer with a first stress inducing layer; and for the second MQW corresponding to the first VCSEL:
blanket coating the second patterned layer with a first stress inducing layer; and performing rapid thermal annealing to induce quantum well mixing in the MQW layer for the first VCSEL and the second VCSEL.

17. The method of claim 16, patterns wherein patterning the first patternable layer covers a first area that is smaller than the second area covered by the second patternable layer such that a stress mismatch can be induced in the MQW layer which induces different concentration of point defects and resulting in a different amounts of quantum well intermixing.

18. The method of claim 16, in which forming top mirrors further comprises:

stripping off the blanket coat, the first and second patternable layers, and the first and second sacrificial layers; and forming a first top mirror on a first Fabry Perot tuning/ current spreading layer corresponding to a first VCSEL, the first top mirror to enable a distinct Fabry Perot resonant wavelength for the first VCSEL, and forming a second top mirror on a second Fabry Perot tuning/current spreading layer corresponding to a second VCSEL, the second top mirror to enable a distinct Fabry Perot resonant wavelength the second VCSEL.

19. The method of claim 18, in which fabricating VCSELs further comprises the array of VCSELs, in which the-first VCSEL is formed by etching and wet oxidation, followed by application of appropriate contacts for the first VCSEL, the second VCSEL is formed by etching and wet oxidation, followed by application of appropriate contacts for the second VCSEL.

* * * * *